US008644098B2

(12) United States Patent
Liu et al.

(10) Patent No.: US 8,644,098 B2
(45) Date of Patent: Feb. 4, 2014

(54) DYNAMIC RANDOM ACCESS MEMORY ADDRESS LINE TEST TECHNIQUE

(76) Inventors: Peiyuan Liu, Carmel, IN (US); Henri Girard, Carmel, IN (US)

( * ) Notice: Subject to any disclaimer, the term of this patent is extended or adjusted under 35 U.S.C. 154(b) by 193 days.

(21) Appl. No.: 13/135,374

(22) Filed: Jul. 1, 2011

(65) Prior Publication Data

US 2012/0250438 A1  Oct. 4, 2012

Related U.S. Application Data

(60) Provisional application No. 61/468,130, filed on Mar. 28, 2011.

(51) Int. Cl.
*G11C 7/00* (2006.01)
*G11C 29/00* (2006.01)
*G11C 29/56* (2006.01)

(52) U.S. Cl.
CPC ............... *G11C 29/56004* (2013.01)
USPC ........................................ 365/201; 365/238.5

(58) Field of Classification Search
USPC .................. 365/200, 201, 238.5
See application file for complete search history.

(56) References Cited

U.S. PATENT DOCUMENTS

| | | | | |
|---|---|---|---|---|
| 4,876,684 A | * | 10/1989 | Guntheroth | .................... 714/719 |
| 5,479,413 A | * | 12/1995 | Sicola et al. | .................... 714/718 |
| 6,046,946 A | | 4/2000 | Nadeau-Dostie et al. | |
| 6,205,564 B1 | | 3/2001 | Kim et al. | |
| 6,453,398 B1 | * | 9/2002 | McKenzie | .................... 711/165 |
| 7,526,702 B2 | * | 4/2009 | Soetemans | .................... 714/735 |
| 7,532,526 B2 | * | 5/2009 | Katrak et al. | .................... 365/201 |
| 8,315,115 B2 | * | 11/2012 | Bomholt et al. | ............... 365/200 |
| 2002/0188904 A1 | * | 12/2002 | Chen et al. | .................... 714/741 |
| 2009/0296505 A1 | | 12/2009 | Shibazaki et al. | |

FOREIGN PATENT DOCUMENTS

| | | |
|---|---|---|
| CN | 101140539 | 3/2008 |
| KR | 20090015506 | 2/2009 |

OTHER PUBLICATIONS

Zhao, Jun; "Maximal Diagnosis of Interconnects of Random Access Memories"; IEEE Transactions on Reliability, vol. 52, No. 4, Dec. 2003.*

Jun Zhao etal, "Maximal Diagnosis of Interconnects of Random Access Memories", 2003 IEEE, vol. 52, No. 4, Dec. 2003.

Finbarr O'Reagan, "Verilog Synthesis Methodology", (Oct. 18, 2001).

* cited by examiner

*Primary Examiner* — Kretelia Graham
(74) *Attorney, Agent, or Firm* — Robert D. Shedd; Robert Levy

(57) ABSTRACT

Verification of the address connections of a memory (14) having multiplexed banks rows and columns commences by selecting a first address location having a bank/row/column value and then writing a pattern to a second location corresponding to the first location where one of the column, row, bank addresses could become stuck high or low. A second pattern gets written to the first location and a comparison occurs between the second pattern and first pattern written to the second location. If the data is the same, then that particular row/column/bank addresses is stuck.

5 Claims, 2 Drawing Sheets

DYNAMIC RANDOM ACCESS MEMORY ADDRESS LINE TEST TECHNIQUE

CROSS-REFERENCE TO RELATED APPLICATIONS

This application claims priority under 35 U.S.C. 119(e) to U.S. Provisional Patent Application Ser. No. 61/468,130, filed Mar. 28, 2011, the teachings of which are incorporated herein.

TECHNICAL FIELD

This invention relates to a technique for verifying the address line connections of a memory having multiplexed rows and columns, such as a Dynamic Random Access Memory (DRAM).

BACKGROUND ART

As among different types of Random Access Memories, there now exists a class of devices know as Dynamic Random Access Memories (DRAM). Such devices, like Static Random Access Memories (SRAM), possess the ability to read and write binary data. However, DRAM can achieve high density due to its structural simplicity. The row and column addresses of DRAM are usually multiplexed on the same address pins.

Designers who implement DRAMs within an electronic circuit often seek to incorporate diagnostic capabilities to automatically verify the operation of the devices in the circuit. In particular, the ability to verify the status of the address pins of a DRAM becomes important. If one of the address pins of the DRAM remain stuck high or low, the device will not operate properly, giving rise to an error.

Present day DRAM verification methods usually do not take the physical pin connections into consideration. Most address verification methods check all of the address space by writing a known data pattern to each location, and then reading the stored pattern from that location for comparison. Checking the physical address space of a DRAM in this manner consumes significant time and does not explicitly verify the address pins of the DRAM.

Thus a need exists for a technique for verifying the address pins of a DRAM.

BRIEF SUMMARY OF THE INVENTION

Briefly, in accordance with a preferred embodiment of the present principles, a method for testing address connections of a memory having multiplexed banks rows and columns commences by selecting a first memory address having selected bank, row and column values. Thereafter, writing of a data pattern to a second memory address occurs, the second address corresponding to the first memory address with one of the selected bank, row and column values stuck at a fixed logic state (for example high or low). Writing of a second (different) data pattern to the first memory address then occurs. A comparison occurs between the second data pattern and data read from the second memory address to determine whether a match exists. If the 2 values read are identical, that address bit did not toggle indicating an error. This case occurs when one of the one the selected bank, row and column values of the first memory address is stuck at a fixed logic state.

DETAILED DESCRIPTION

Figure 1:
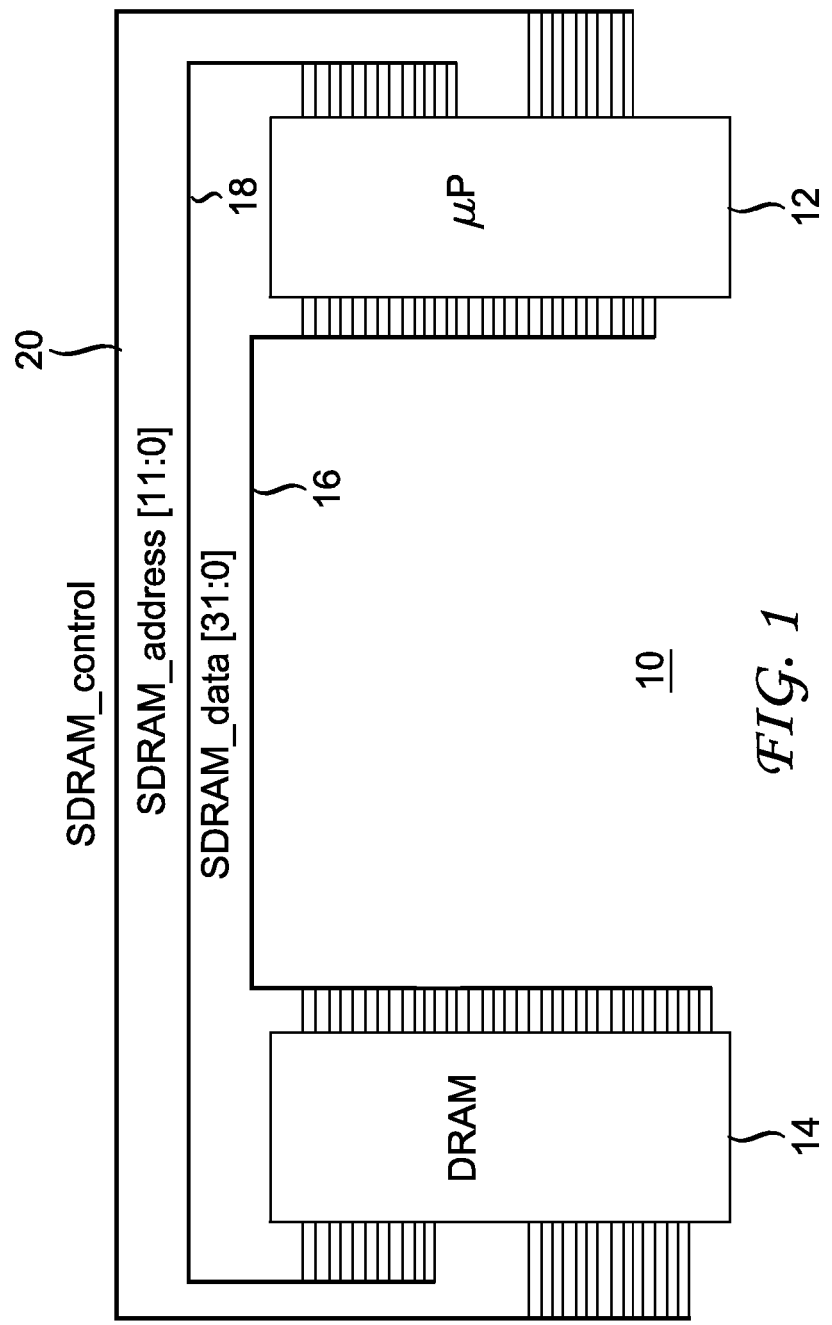
FIG. 1 depicts a schematic drawing of a portion of an electronic according device including a DRAM coupled to a microprocessor of the prior art.

FIG. 1 depicts a block schematic diagram of a portion of an electronic device 10 that includes a microprocessor (RP) 12 and a DRAM 14. Typically, the electronic 10 device can include other components (not shown) but for purposes of understanding the memory address pin verification technique of the present principles, only the microprocessor 12 and the DRAM 14 play any role. The microprocessor 12 writes data to and reads data from the DRAM 14 via a data bus 16, which in the illustrated embodiment has a width of 32 bits [31:0]. The address within the DRAM 14 written to and read from by the microprocessor 12 will depend on the address placed on an address bus 18.

In the illustrated embodiment of FIG. 1, the address bus 18 coupling the microprocessor 12 and the DRAM 14 has a width of 12 bits [11:0]. In practice, multiplexing of the address bus takes place in terms of the banks, rows, and columns within the DRAM 14 to enable addressing of substantially more memory locations than the width of the address bus.

A DRAM control bus 20 also links the microprocessor 12 to the DRAM 14. The control bus carries control information which typically includes a chip select (CS) signal, row and column address strobe signals (RAS and CAS, respectively) and a write enable signal (WE).

Present day diagnostic techniques for DRAMs typically serve to verify the address space typically by writing a known data pattern to each location, and then reading the stored pattern from that location for comparison.

Checking the physical address space of a DDR SDRAM in this manner does not explicitly verify the address pins of the DDR SDRAM, that is, whether any of the pins remain stuck high or low.

Figure 2:
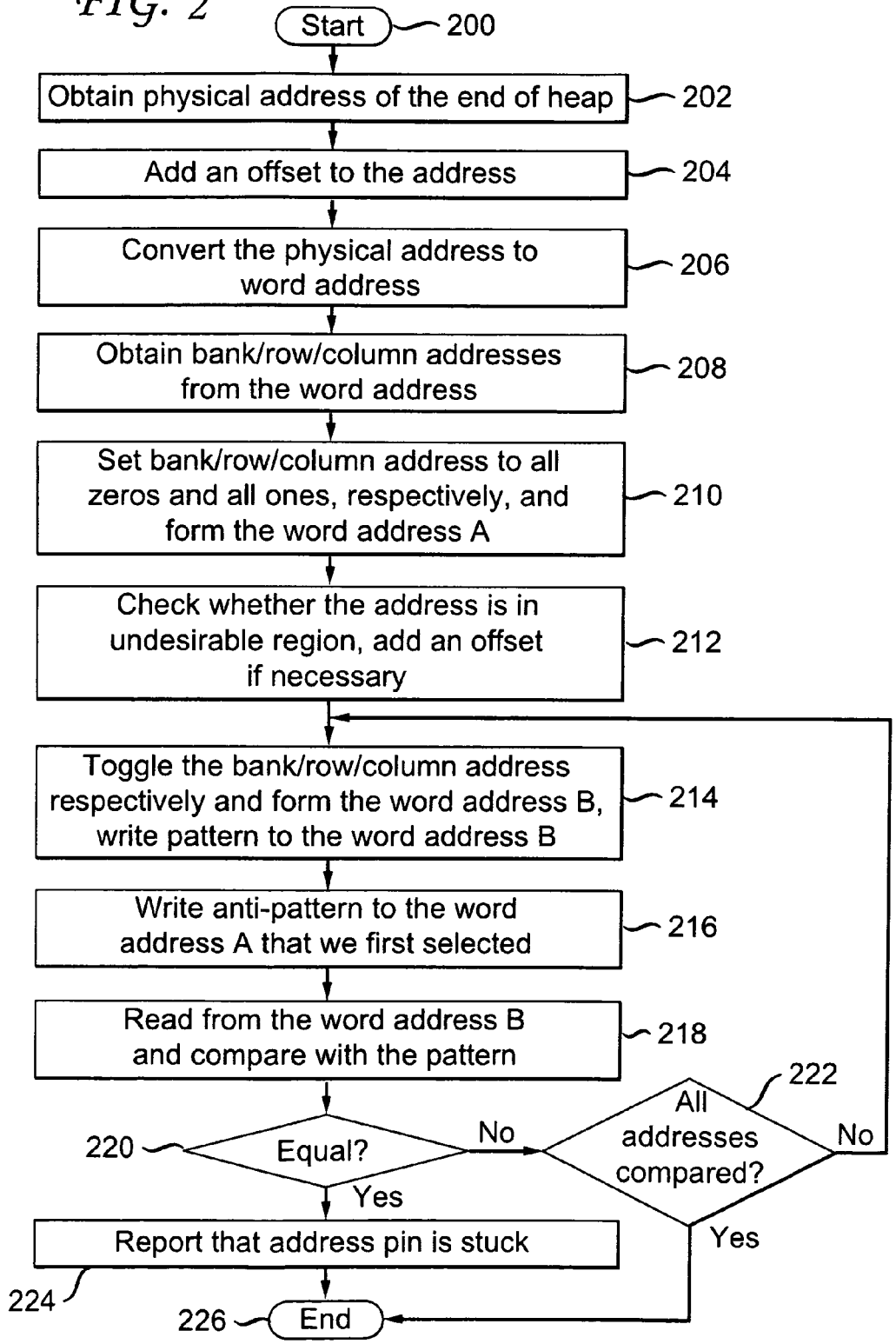
FIG. 2 depicts in flow chart form the steps of a method in accordance with a preferred embodiment of the present principles for verifying whether the address pins of the DRAM of FIG. 1 are stuck high or low.

In accordance with a preferred embodiment of the present principles, verification of the state of the address pins of a DRAM, such as DRAM 14 occurs in accordance with the method depicted in flow chart form in FIG. 2. The verification method of the present principles entails a mapping of the row/column/bank address to a word address.

The following code depicts an exemplary mapping of the bank/row/column address to a word address.

```
{
    col_addr = w_dwaddr[9:0];
    bnk_addr = w_dwaddr[12:10] ;
    row_addr = {3'b0, w_dwaddr[25:13]};
}
``` where w_dwaddr is an address of a 32-bit word (4 bytes), col_addr is the column address, bnk_addr is the bank address, 3'b0 is a count of a three-bit synchronous counter (as is known in the Verilog simulation language), and row_addr is the row address. The word address can be converted to physical address by shifting 4 bits to the left.

To accomplish such mapping, the process of FIG. 2 commences with start step 200 followed by execution of step 202 to obtain the physical address of the end of the heap of the DRAM 14 of FIG. 1. Thereafter, an offset gets added to this address (step 204 of FIG. 2) before converting the physical address to a word address during step 206 in the manner discussed above. This is to prevent writing to the undesirable region of the DRAM of FIG. 1. Next, step 208 undergoes execution to obtain the bank/row/column address from the word address.

Next, we set one of the bank/row/column address to all ones and all zeros, respectively, then calculate a word address from the bank/row/column address mentioned before. This address corresponds to word address "A". If the address lies in an undesirable region of the DRAM 14 of FIG. 1, an offset gets added during step 212.

During step 214, the bank/row/column address gets toggled to form a word address B at which the data pattern (i.e. the pattern) gets written. Thereafter, a second data pattern, referred to as "the anti-pattern", gets written to the first location (corresponding to the word address A) during step 216. Thereafter, step 218 undergoes execution during which the data from the word address B gets read. A comparison then occurs during step 220 between the second data pattern and data read from the word addresses B. If the data do not match (indicating no stuck address pin for the particular bank/row/column value), then step 222 occurs to check whether the process has used all of the addresses for comparison purposes.

If not, then step 214 undergoes execution to toggle the bank/row/column address and to write a second pattern at that new address.

During execution of step 220, a match could exist between the first and second patterns. The existence of a match between the first and second patterns occurs when an address pin has become stuck at a high or low value. Thus upon finding a match upon execution of step 220, then step 224 undergoes execution to report a stuck address pin prior to ending the process during step 226.

To better understand the above-described process, consider the following example predicated on a DRAM having eight banks so the memory has 3 bank address pins to select a particular bank in the memory. The verification technique commences by first setting bank address to 000 (with the row and column address set at a particular value). Thereafter, a data pattern (i.e., the pattern) gets written to bank address 001, 010, 011 . . . 110, 111, and a second pattern (i.e., the anti-pattern) subsequently gets written to the first location for comparison the pattern written to each of these bank addresses. If the data pattern at any of the bank addresses is the same as the second pattern, then one or more of bank addresses have become stuck high. The process gets repeated for the bank address 111. If the data at any of the bank addresses matches the third pattern, same, then one or more of bank addresses pins is stuck low.

This approach applies to row/column/bank addresses generally but extra caution becomes necessary when dealing with row/column addresses since typical DRAM memory chips share row address and column address on the same pin.

For example, the row address [11:0] and column address [11:0] physically share the address pins A11-A0. Furthermore, in most instances the DRAM address always starts at 0th location of the data burst (of 8) which is 4 bytes (32 bit data width)×8 (burst)=32 bytes. Thus, a column address [2:0] will always be zero. Under such circumstances, the total number of word address gets divided into 4 groups, with the bank address toggling only, then row address [12:10] toggling only, then row/column address [9:2] toggling only, and the row address [2:0] toggling only. The same test strategy is followed on each group of address pins, as mentioned in the previous paragraph.

In practice, The DRAM 14 of FIG. 1 will carry a program executed by the microprocessor 12 for performing the address verification technique so caution becomes necessary to avoid writing into an address location used by the program. Depending on the linker settings, the DRAM 14 would normally have data, bss and text sections, a heap and a stack area. The memory locations selected for reading and writing cannot lie in these areas. Address pin verification in accordance with the present principles commences by first carefully selecting memory location, writing a data pattern to that location, reading from other memory location where the column, row, bank addresses could get stuck high or low and comparing the results with the data pattern written into the memory location first selected. If the data matches, then that particular row/column/bank address has become stuck.

The foregoing describes a technique for verifying address pin connections of a memory having multiplexed banks, rows, and columns

The invention claimed is:

1. A method for testing at least one address connection of a memory having multiplexed banks, rows, and columns, comprising:
   (a) obtaining a first memory address from a plurality of memory addresses, the plurality of memory addresses being selected from the group consisting of bank, row, and column addresses, by setting all ones or all zeros to one of a bank, row, and column address;
   (b) writing a first data pattern to the plurality of memory addresses beginning at a second memory address, the second memory address being different from the first memory address, with one of the plurality of memory addresses having a value stuck at a fixed logic state;
   (c) writing a second data pattern to the plurality of memory addresses beginning at the first memory address, the second data pattern being different from the first data pattern;
   (d) reading a resulting data pattern from the plurality of memory addresses beginning at the second memory address; and
   (e) comparing the second data pattern to the resulting data pattern to determine whether a match exists between any portion of the second data pattern and a corresponding portion of the resulting data pattern.

2. The method according to claim 1 wherein the steps (a)-(e) are repeated for different bank, row, and column values of the first memory address.

3. The method according to claim 2 further comprising toggling values associated with the plurality of memory addresses separately.

4. Apparatus for testing at least one address connection of a memory having multiplexed banks, rows, and columns, comprising a memory and a processor, the processor configured to perform:
   (a) obtain a first memory address from a plurality of memory addresses, the plurality of memory addresses being selected from the group consisting of bank, row, and column addresses, by setting all ones or all zeros to one of a bank, row, and column address;
   (b) write a first data pattern to the plurality of memory addresses beginning at a second memory address, the second memory address being different from the first memory address, with one of the plurality of memory addresses having a value stuck at a fixed logic state;
   (c) write a second data pattern to the plurality of memory addresses beginning at the first memory address, the second data pattern being different from the first data pattern;

(d) read a resulting data pattern from the plurality of memory addresses beginning at the second memory address; and (e) compare the second data pattern to the resulting data pattern to determine whether a match exists between any portion of the second data pattern and a corresponding portion of the resulting data pattern.

5. The apparatus according to claim 4 wherein the processor is configured to collectively write the first pattern, write the second pattern, and compare for different bank, row, and column values of the first memory address.

* * * * *